US008207470B2

(12) United States Patent
Jeon et al.

(10) Patent No.: US 8,207,470 B2

(45) Date of Patent: Jun. 26, 2012

(54) APPARATUS FOR GENERATING REMOTE PLASMA

(75) Inventors: Hyeong-Tag Jeon, Seoul (KR); Sang-Hyun Woo, Seoul (KR); Hyung-Chul Kim, Chungcheongbuk-do (KR); Chin-Wook Chung, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 323 days.

(21) Appl. No.: 12/547,163

(22) Filed: Aug. 25, 2009

(65) Prior Publication Data

US 2010/0096367 A1 Apr. 22, 2010

(30) Foreign Application Priority Data

Oct. 20, 2008 (KR) ........................ 10-2008-0102578
Aug. 3, 2009 (KR) ........................ 10-2009-0071296

(51) Int. Cl.
*B23K 10/00* (2006.01)

(52) U.S. Cl. ......... 219/121.36; 219/121.43; 219/121.52; 118/723.1; 156/345.34

(58) Field of Classification Search ............. 219/121.41, 219/121.43, 121.44, 121.57; 118/723 R, 118/723 ER; 156/345.34, 345.35, 345.47
See application file for complete search history.

(56) References Cited

U.S. PATENT DOCUMENTS 5,767,683 A * 6/1998 Stearns et al. ................ 324/464
2009/0302002 A1* 12/2009 Collins et al. .................. 216/67

FOREIGN PATENT DOCUMENTS

KR 1020060015759 8/2007

* cited by examiner

*Primary Examiner* — Mark Paschall
(74) *Attorney, Agent, or Firm* — Florek & Endres PLLC

(57) ABSTRACT

Provided is an apparatus for generating remote plasma, which can improve thin-film quality by preventing an arc at a bias electrode. The apparatus includes a radio frequency (RF) electrode installed inside an upper portion of a chamber, a bias electrode installed apart from the RF electrode, and including a plurality of through holes through which plasma passes, wherein a bias power is supplied to the bias electrode, a plasma generating unit formed between the RF electrode and the bias electrode, wherein a plasma gas is supplied to the plasma generating unit, and a ground electrode installed under and spaced apart from the bias electrode, and including plasma through holes corresponding to the through holes of the bias electrode, wherein a pulsed DC bias of a second voltage level, which has a first voltage level periodically, is applied to the bias electrode.

17 Claims, 3 Drawing Sheets

200
310
210
150
152
154
152
250
130
120
300
500
510
512
514
260
410
400
110
100
102

APPARATUS FOR GENERATING REMOTE PLASMA

BACKGROUND ART

1. Field of the Invention

The present invention relates to an apparatus for generating remote plasma, and more particularly, to an apparatus for generating remote plasma that improves thin-film quality by reliably removing charges accumulated in a bias electrode.

2. Description of the Related Art

In recent years, as semiconductor devices shrink in size, it is required to perform plasma treatment under higher vacuum state for realizing patterns with high aspect ratio in dry etching, and filling a filling material into a hole with high aspect ratio in plasma chemical vapor deposition (plasma CVD) and atomic layer deposition (ALD).

In a typical parallel plate type apparatus for generating plasma, a substrate electrode with a substrate mounted thereon and an opposite electrode are installed in a vacuum chamber, and a high frequency voltage is then applied between the substrate electrode and the opposite electrode using high frequency power source for electrode. Resultantly, plasma is generated in the vacuum chamber.

However, according to the above configuration, the generated plasma does not uniformly react with the substrate mounted in the chamber, and plasma ions in the plasma have a direct impact on a wafer substrate, thereby causing the substrate to be damaged.

To solve such a limitation, positive ions in plasma are appropriately controlled by installing a DC bias electrode in a lower portion of a plasma generating unit, and thus it is possible to improve thin-film quality in some degree.

However, there is still a limitation in that positive ions created during the generation of plasma cannot be reliably trapped even using the above-described configuration.

SUMMARY OF THE INVENTION

An object of the present invention is to provide an apparatus for generating remote plasma that can reliably remove charges accumulated in a bias electrode to thereby improve thin-film quality.

According to an aspect of the present invention, there is provided an apparatus for generating remote plasma, including: a radio frequency (RF) electrode installed inside an upper portion of a chamber; a bias electrode installed apart from the RF electrode, and including a plurality of through holes through which plasma passes, wherein a bias power is supplied to the bias electrode; a plasma generating unit formed between the RF electrode and the bias electrode, wherein a plasma gas is supplied to the plasma generating unit; and a ground electrode installed under and spaced apart from the bias electrode, and including plasma through holes corresponding to the through holes of the bias electrode, wherein a pulsed DC bias of a second voltage level, which has a first voltage level periodically, is applied to the bias electrode.

According to another aspect of the present invention, there is provided an apparatus for generating remote plasma, including: an RF antenna installed on an exterior of a chamber; a plasma generating unit formed adjacent to the RF antenna inside the chamber, and generating plasma; and a bias electrode installed under the plasma generating unit, and including a plurality of through holes through which the generated plasma passes, wherein a bias power is supplied to the bias electrode, wherein a pulsed DC bias of a second voltage level, which has a first voltage level, is applied to the bias electrode.

According to still another aspect of the present invention, there is provided An apparatus for generating remote plasma, including: a plasma generating unit generating a plasma gas, and including an inductively coupled plasma (ICP) coil winding therearound; a bias electrode installed under the plasma generating unit, and including a plurality of plasma through holes through which plasma passes; and a reacting unit formed under the bias electrode, and including a substrate loading unit on which a substrate is mounted, and a gas supply unit installed on the substrate loading unit to supply a source gas or purge gas, wherein a pulsed DC bias of a second voltage level, which has a first voltage level, is applied to the bias electrode.

An entire surface of the bias electrode may be coated with an etch-resistance metal containing tungsten or titanium.

A capacitor for removing charges remaining on the bias electrode may be connected to a bias power source in series.

The bias electrode may be made of a metal, and a surface of the bias electrode may be anodized.

The first voltage level may be a positive voltage level, and the second voltage level may be a negative voltage level. Alternatively, the first voltage level may be a negative voltage level, and the second voltage level may be a positive voltage level.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENT

Now, preferred embodiments of the present invention will be described in detail with reference to the accompanying drawings.

Figure 1:
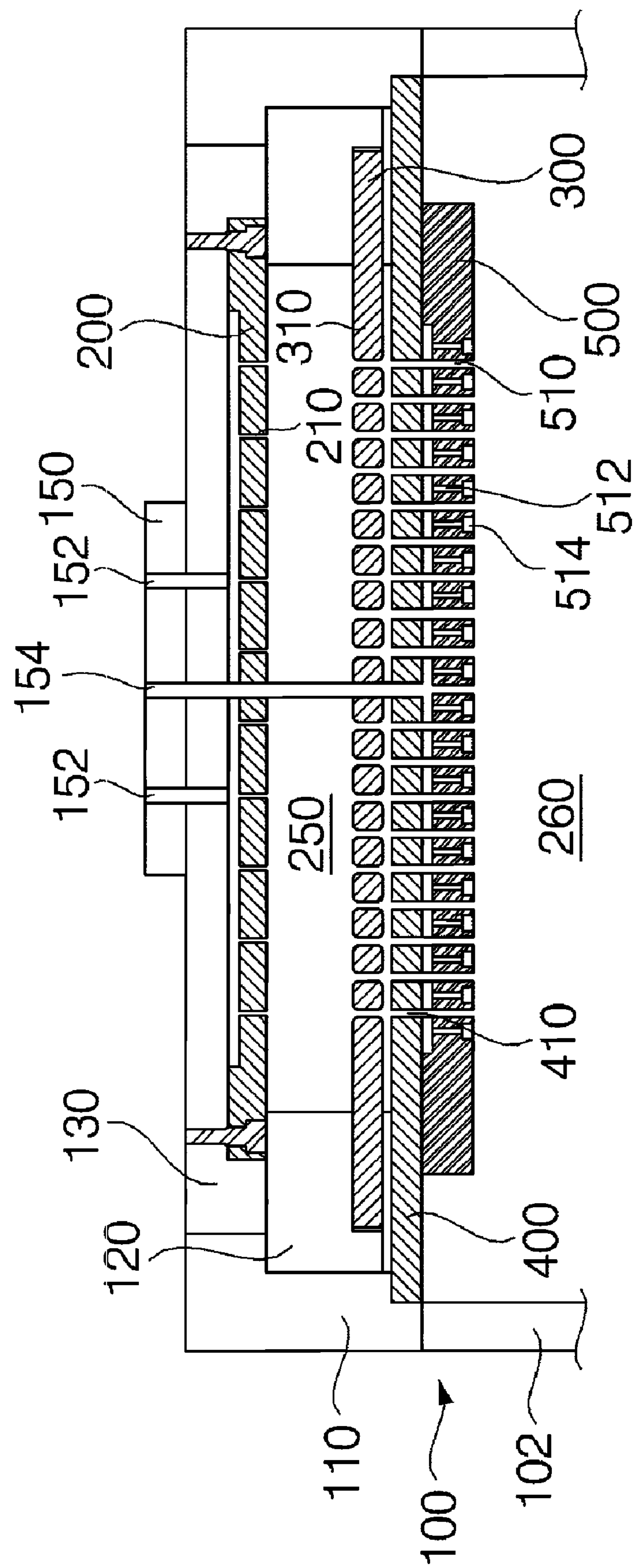
FIG. 1 is a sectional view illustrating an apparatus for generating remote plasma according to an embodiment of the present invention.

FIG. 1 is a sectional view illustrating an apparatus for generating remote plasma according to an embodiment of the present invention.

Referring to FIG. 1, a chamber 100 includes a plasma generating unit 250 and a reacting unit 260, which are vertically partitioned. To this end, the chamber 100 includes a sidewall 102, an upper insulation member 130, and a plurality of sealing blocks 110 and 120 for connecting the sidewall 102 and the upper insulation member 130 and enhancing the assemblability. The insulation member 130 may include, for example, quartz.

Header (150)

A header 150 including a plasma gas supply passage 152 and a supply passage 154 for supplying a source gas or a purge gas is mounted on the insulation member 130. In particular, the supply passage 154 extends to a shower head 150, which will be described later. Although it is exemplarily illustrated in this embodiment that the supply passage 154 is formed in the header 150, the supply passage 154 may be formed such that it extends to the shower head 500 from a side of the chamber 100.

RF Electrode (200)

A radio frequency (RF) power is supplied to an RF electrode 200 so as to generate plasma, and a plurality of through holes 210 through which a plasma gas supplied through the plasma gas supply passage 152 passes are disposed in the RF electrode 200.

Alternatively, an RF antenna may be installed on the insulation member 130 instead of the RF electrode 200. An example of the RF antenna is disclosed in the Korean Patent Publication No. 2007-82746, in which two loop antenna elements where a power supply terminal is formed at one end and a ground terminal is formed at the other end are horizontally spaced apart at regular intervals and electrically connected to each other in parallel, the power supply terminal and ground terminal of each antenna are symmetrically positioned with respect to the center of the antenna element, and a horizontally-bended portion of one of the antenna elements is placed between the power supply terminal and the ground terminal of the other one of the antennal elements.

When the RF antenna is employed, a ground electrode 400 to be described later is not required and therefore the configuration may be changed.

Plasma Generating Unit (250)

A plasma generating unit 250 is formed between the RF electrode 200 and the bias electrode 300. The plasma generated in the plasma generating unit 250 is supplied into the chamber 100 via the bias electrode 300 and the ground electrode 400.

Bias Electrode (300)

The bias electrode 300 is positioned under the plasma generating unit 250 to trap positive ions in the plasma generated in the plasma generating unit 250. A plurality of through holes 310 through which the plasma pass are uniformly formed over the entire surface of the bias electrode 300. That is, the plurality of through holes 310 are uniformly formed in the bias electrode 300, and resultantly the plasma can be uniformly supplied to a target such as a wafer.

According to an embodiment of the present invention, the bias electrode 300 may be made of a metal and its surface may be anodized so that it is possible to prevent the contamination caused by metal impurities. Also, according to another embodiment of the present invention, an arc phenomenon caused by charges accumulated on the surface of the bias electrode 300 can be prevented by coating the entire surface of the bias electrode 300 with an etch-resistant metal containing tungsten or titanium.

Ground Electrode (400)

Through holes 410 through which the plasma pass are formed in the ground electrode 400 installed under and apart from the bias electrode 300. The through holes 410 of the ground electrode 400 are formed such that they are aligned with the through holes 310 of the bias electrode 300.

As described above, the ground electrode 400 may be omitted when the RF antenna is employed instead of the RF electrode 200.

Shower Head (500)

In the shower head 500, a plasma guide hole 510 and a source gas guide hole 512 are formed. The plasma guide hole 510 corresponds to the through hole 410 of the ground electrode 400. A source gas or purge gas supplied through the supply passage 154 passes through the source gas guide hole 512. That is, the source gas or purge gas supplied through the supply passage 154 is introduced into a confined space formed between the surface of the shower head 500 and the rear side of the ground electrode 400, and then discharged through the source gas guide hole 512. A spray nozzle 514 may be formed on one end of the source gas guide hole 512.

Here, another source supply unit which differs in configuration from the shower head 500 may be employed. That is, a ring type source supply unit having, for example, spray holes, may be applicable instead of the shower head 500.

According to the present invention, a pulsed DC bias of a second voltage level, which has a first voltage level, is applied to the bias electrode 300.

Figure 2:
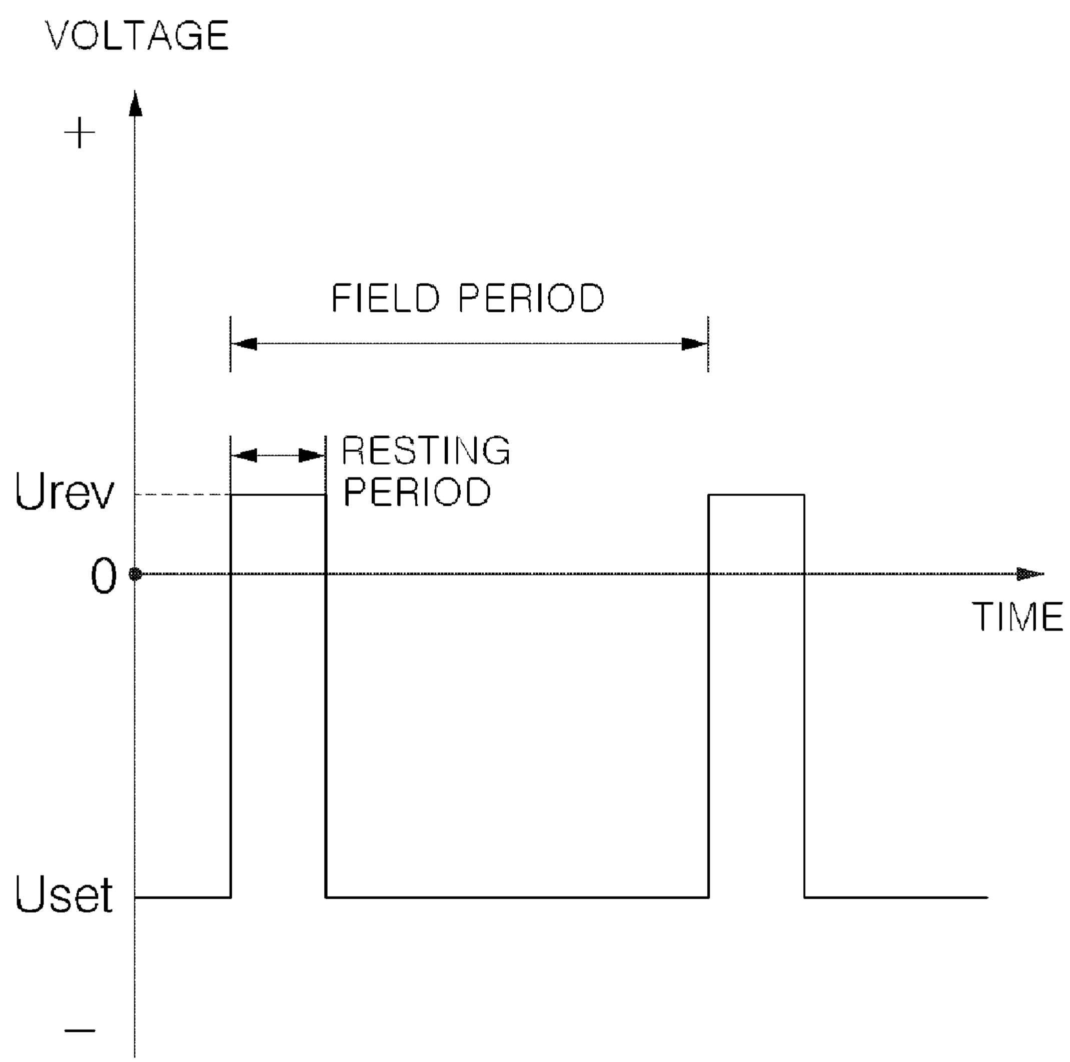
FIG. 2 illustrates a pulsed DC bias voltage applied to a bias electrode.

FIG. 2 illustrates a pulsed DC bias voltage applied to the bias electrode 300. In this embodiment, a negative pulsed DC bias having a positive voltage level during a predetermined period periodically is applied, however, the present invention is not limited thereto. Therefore, a positive pulsed DC having a negative level during a predetermined period periodically may be applied to the bias electrode 300.

Referring to FIG. 2, the pulsed DC bias includes a negative pulse Uset having a negative voltage level during a predetermined period basically, and also includes a positive pulse Urev having a positive level during a resting period.

According to this structure, positive ions in the plasma are trapped on the surface of the bias electrode 300 due to the negative pulse Uset, and then the trapped positive ions are repelled toward the plasma generating unit 250 and vanished due to the positive pulse Urev. Otherwise, the trapped positive ions are neutralized by negative ions pulled by the positive pulse Urev.

Therefore, an arch phenomenon caused by charge accumulation can be prevented by periodically removing charges accumulated on the surface of the bias electrode 300.

In addition, the present invention is advantageous in that it is possible to remove charges remaining on the bias electrode 300 because the bias electrode 300 is made of a metal, the metal impurity-caused contamination can be prevented by anodizing the surface of the bias electrode 300 during the generation of plasma, and the electrode itself acts as a capacitor.

In contrast, since the anodized surface is an insulator, charges may be accumulated on the anodized surface, which may cause an arc to be generated.

Accordingly, as described above, the entire surface of the bias electrode 300 may be coated with an etch-resistant metal containing tungsten or titanium according to another embodiment of the present invention. According to this embodiment, it is advantageous in that the bias electrode 300 can sufficiently stand up even if a small-scaled arc discharge is generated due to the charges remaining on the surface of the electrode 300 in spite of an applied pulsed DC bias.

Furthermore, the charges remaining on the bias electrode 300 can be removed by connecting a capacitor to a bias power source in series. That is, the charges remaining on the bias electrode 300 can be removed because the charges remaining on the bias electrode 300 move toward one side electrode of the capacitor according to the electrostatic induction phenomenon and arranged to face charges of the other electrode of the capacitor.

The apparatus for generating plasma according to the present invention is also applicable to a chemical vapor deposition (CVD) apparatus or an atomic layer deposition (ALD) where ON/OFF operations of plasma are frequently performed. The apparatus for generating plasma according to the present invention can be used to form an oxide, a silicon compound, a single crystal compound, a polycrystal compound, and an amorphous compound on a substrate of Si, SiGe, Ge, $Al_2O_3$, GaAs and SiC.

A plasma source applied to the apparatus for generating plasma according to the present invention may include every plasma source, for example, high density plasma (HDP), inductively coupled plasma (ICP), capacitively coupled plasma (CCP), and electron cyclotron resonance (ECR).

Figure 3:
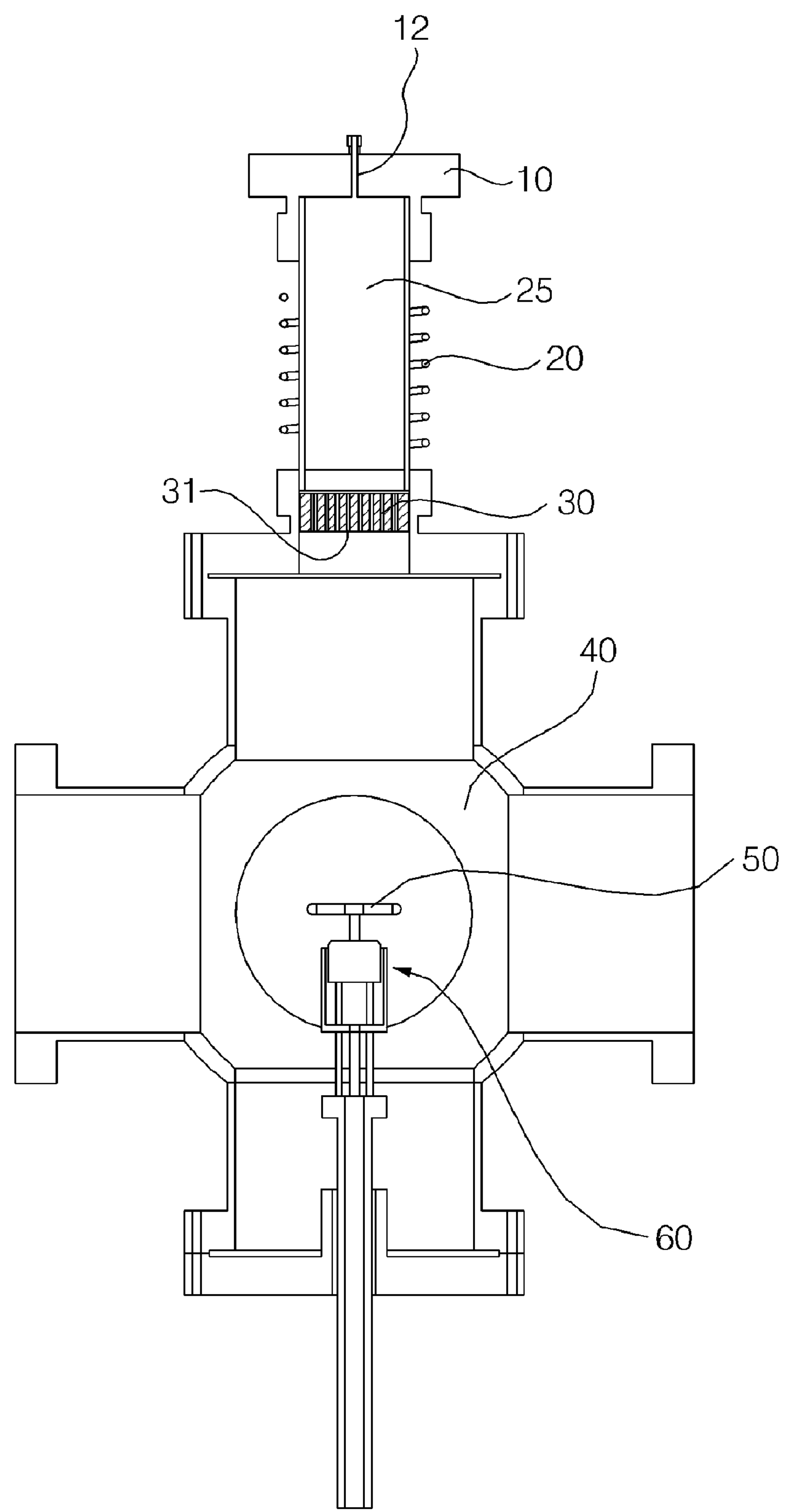
FIG. 3 illustrates an apparatus for generating remote plasma according to another embodiment of the present invention.

FIG. 3 illustrates an apparatus for generating remote plasma according to another embodiment of the present invention.

The embodiment of FIG. 3 exemplarily illustrates an ICP generating apparatus in which a plasma generating unit 25 is formed over a chamber 40, and an ICP coil winds around the plasma generating unit 25. Furthermore, a header 10 having a plasma gas supply passage 12 is mounted on the plasma generating unit 25, and a supply pipe (not shown) is connected to an inlet of the plasma gas supply passage 12.

A bias electrode 30 including a plurality of through holes 31 arranged regularly is installed between the plasma generating unit 25 and the chamber 40, and a substrate is loaded onto a substrate loading unit 60 inside the chamber 40.

Like the embodiment of FIG. 1, a negative pulsed DC bias having a positive voltage level periodically is also applied to the bias electrode 30 in this embodiment of FIG. 3.

A source supply unit 50 is disposed over the substrate loading unit 60. For example, a ring type source supply unit 50 may be used, in which a plurality of spray holes through which a source gas or purge gas is sprayed are formed in the bottom surface.

According to the structure of this embodiment, when an RF power is supplied to the plasma generating unit 25 by the ICP coil, an induced electric field is applied to the plasma gas supplied to the plasma generating unit 25, thereby generating the plasma.

According to this embodiment, positive ions in the plasma are trapped on the surface of the bias electrode 300 due to the negative pulse Uset, and then the trapped positive ions are repelled toward the plasma generating unit 250 and vanished due to the positive pulse Urev. Otherwise, the trapped positive ions are neutralized by negative ions pulled by the positive pulse Urev.

Also, according to this embodiment, the source gas and purge gas may be supplied using a ring type source supply unit instead of a shower head.

According to the foregoing embodiments of the present invention, the positive ions created during the generation of plasma can be reliably trapped by applying a negative pulsed DC bias to a bias electrode, thus preventing a substrate and a thin film from being damaged and improving thin-film quality.

Furthermore, it is possible to prevent an arc phenomenon caused by charge accumulation by periodically removing the charges accumulated on the surface of a bias electrode using a positive pulse that is periodically applied.

In particular, the entire surface of the bias electrode is coated with an etch-resistant metal containing tungsten or titanium, and resultantly it is advantageous in that the bias electrode can sufficiently stand up even if a small-scaled arc discharge is generated due to residual charges.

Moreover, charges remaining on the bias electrode can be removed by connecting a capacitor to a pulsed DC bias power source in series.

While the present invention has been described in detail, it should be understood that various changes, substitutions and alterations can be made hereto without departing from the spirit and scope of the invention as defined by the appended claims.

What is claimed is:

1. An apparatus for generating remote plasma, comprising:

a radio frequency (RF) electrode installed inside an upper portion of a chamber;

a bias electrode installed apart from the RF electrode, and including a plurality of through holes through which plasma passes, wherein a bias power is supplied to the bias electrode;

a plasma generating unit formed between the RF electrode and the bias electrode, wherein a plasma gas is supplied to the plasma generating unit; and a ground electrode installed under and spaced apart from the bias electrode, and including plasma through holes corresponding to the through holes of the bias electrode, wherein a pulsed DC bias of a second voltage level, which has a first voltage level periodically, is applied to the bias electrode, wherein the first and second voltage levels have different polarities.

2. The apparatus of claim 1, wherein an entire surface of the bias electrode is coated with an etch-resistance metal containing tungsten or titanium.

3. The apparatus of claim 2, wherein a capacitor for removing charges remaining on the bias electrode is connected to a bias power source in series.

4. The apparatus of claim 1, wherein the RF electrode includes a plurality of through holes for supplying the plasma gas to the plasma generating unit.

5. The apparatus of claim 1, wherein the bias electrode is made of a metal, and a surface of the bias electrode is anodized.

6. The apparatus of claim 1, wherein a shower head is installed under the ground electrode, the shower head including a passage through which a source gas or purge gas passes, and another passage through which the plasma generated in the plasma generating unit passes.

7. An apparatus for generating remote plasma, comprising:

an RF antenna installed on an exterior of a chamber;

a plasma generating unit formed adjacent to the RF antenna inside the chamber, and generating plasma; and a bias electrode installed under the plasma generating unit, and including a plurality of through holes through which the generated plasma passes, wherein a bias power is supplied to the bias electrode, wherein a pulsed DC bias of a second voltage level, which has a first voltage level periodically, is applied to the bias electrode, and wherein the first and second voltage levels have different polarities.

8. The apparatus of claim 7, wherein an entire surface of the bias electrode is coated with an etch-resistance metal containing tungsten or titanium.

9. The apparatus of claim 8, wherein a capacitor for removing charges remaining on the bias electrode is connected to a bias power source in series.

10. An apparatus for generating remote plasma, comprising:

a plasma generating unit generating a plasma gas, and including an inductively coupled plasma (ICP) coil winding therearound;

a bias electrode installed under the plasma generating unit, and including a plurality of plasma through holes through which plasma passes; and a reacting unit formed under the bias electrode, and including a substrate loading unit on which a substrate is mounted, and a gas supply unit installed on the substrate loading unit to supply a source gas or purge gas, wherein a pulsed DC bias of a second voltage level, which has a first voltage level periodically, is applied to the bias electrode, wherein the first and second voltage levels have different polarities.

11. The apparatus of claim 10, wherein the gas supply unit includes a ring type supply unit having a plurality of spray holes formed in a bottom thereof.

12. The apparatus of claim 1, wherein the first voltage level is a positive voltage level, and the second voltage level is a negative voltage level.

13. The apparatus of claim 1, wherein the first voltage level is a negative voltage level, and the second voltage level is a positive voltage level.

14. The apparatus of claim 7, wherein the first voltage level is a positive voltage level, and the second voltage level is a negative voltage level.

15. The apparatus of claim 7, wherein the first voltage level is a negative voltage level, and the second voltage level is a positive voltage level.

16. The apparatus of claim 10, wherein the first voltage level is a positive voltage level, and the second voltage level is a negative voltage level.

17. The apparatus of claim 10, wherein the first voltage level is a negative voltage level, and the second voltage level is a positive voltage level.

* * * * *